(12) United States Patent
Liu et al.

(10) Patent No.: US 7,662,709 B2
(45) Date of Patent: Feb. 16, 2010

(54) SURFACE MOUNTING METHOD

(75) Inventors: Pai-Chou Liu, Kaohsiung (TW);
Wen-Shin Lin, Zhongli (TW);
Sheng-Hong Cheng, Kaohsiung (TW);
Yu-Hsin Lee, Kaohsiung (TW);
Ming-Chia Hsieh, Changhua County (TW); Kuan-Hung Yeh, Penghu County (TW); Chia-Wei Chang, Pingtung (TW); Tsung-Chi Chen, Tainan County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 287 days.

(21) Appl. No.: 11/617,220

(22) Filed: Dec. 28, 2006

(65) Prior Publication Data
US 2007/0254469 A1     Nov. 1, 2007

(30) Foreign Application Priority Data
Apr. 28, 2006    (TW) ............................ 95115203 A

(51) Int. Cl.
*H01L 21/4763* (2006.01)

(52) U.S. Cl. .................. 438/620; 438/618; 438/612; 438/613

(58) Field of Classification Search ......... 438/613–615, 438/618–624; 257/758, 773–774
See application file for complete search history.

(56) References Cited

U.S. PATENT DOCUMENTS

| 2006/0124703 | A1* | 6/2006 | Fang et al. ............. 228/180.22 |
| 2006/0214296 | A1* | 9/2006 | Okamoto et al. ............ 257/751 |
| 2007/0069346 | A1* | 3/2007 | Lin et al. .................... 257/673 |

* cited by examiner

*Primary Examiner*—Dung A. Le
(74) *Attorney, Agent, or Firm*—Thomas, Kayden, Horstemeyer & Risley

(57) ABSTRACT

An improved surface mounting method applied in a semiconductor package process is provided, wherein the method comprises the following steps: First a substrate having at least one pad set on one surface of the substrate is provided. Then a mask having at least one opening associated with one of the at least one pad is set on the substrate, wherein each opening is separated into a plurality of sub-openings by a segregator to expose the pad. Subsequently, a printing process is conducted to form a conductive layer on each pad. After removing the mask, a passive device is set on the conductive layer over the pad, and a heating treatment is conducted to fix the passive device on the pad.

16 Claims, 3 Drawing Sheets

SURFACE MOUNTING METHOD

RELATED APPLICATIONS

The present application is based on, and claims priority from, Taiwan Application Serial Number 95115203, filed Apr. 28, 2006, the disclosure of which is hereby incorporated by reference herein in its entirety.

FIELD OF THE INVENTION

The present invention relates to a surface mounting method, and more particularly relates to a surface mounting method applied for passive components to overcome the problems due to the defeat of solder contact used for mounting and electrically connecting the passive components with a substrate during a surface mounting process.

BACKGROUND OF THE INVENTION

A subsequent package process or further assembly process should be conducted to a passive device cutting from wafer to produce a passive component having a passive device set on a substrate or on a device carrier; or having at least one passive device set on a substrate or on a printed circuit board with other active devices or other passive devices. Accordingly, the passive device has to be mounted on the substrate, the device carrier or the printed circuit board during either the package process or further assembly process. There are various ways for a passive device to be mounted on. Generally, the surface mounting method is the most common way for mounting the passive device on a substrate with advantages of high processing speed and high mounting precision.

FIGS. 1A and 1B illustrate cross views of a conventional surface mooting process to form a passive component. First regarding to FIG. 1A, a steel plate 14 having a plurality of opening 16 is formed on a substrate 10, wherein each opening 16 associates with a pad 12 set on the substrate 10 and exposes the pad 12 there from. A printing process is conducted to deposit solder 18 on the exposed pads 12. The steel plate 14 subsequently is removed. After the steel plate 14 is removed, a passive device 20 is located on the steel plate 14, and the power contact and the grounding contact of the passive device 20 are electrically connect to the pads 12 respectively. A solder reflow process is then conducted on the pads 12 to fix the passive device 20 on the substrate 10 by the solder deposited on the pads 12 (shown on FIG. 1B).

However, the reflow step of the prior passive devices surface mounting process may defeat the solder contact 19 by the melted solder 18 during the solder reflow process. For example, the melted solder 18 may flow or spill on to undesirable portions of the substrate 10 to cause the electrical contact between the substrate 10 and the passive device 20 failure, consequently to cause the end product invalid.

There is therefore a need to develop an improved surface mounting method to mount a passive device onto a substrate and to avoid the prior problems due to the melted solder during the reflow process.

SUMMARY OF THE INVENTION

To resolve the aforementioned problems, one aspect of the present invention is to provide an improved surface mounting method to resolve the problems of melted solder which flows or spills on undesirable portions of the substrate during the reflow process so to cause the electrical contact between the substrate and the passive device failure.

Another aspect of the present invention is to provide an improved surface mounting method for avoid the prior problems due to the melted solder so as to increase the yield of passive components.

An additional aspect of the present invention is to provide an improved surface mounting method to reduce the amount of solder used for mounting the passive device onto a substrate so to reduce the manufacturing cost of passive components.

In accordance with the embodiments of the present invention described therefore, the improved process of the present invention comprises several steps as following: First a substrate having a plurality of pads set on the surface of the substrate is provided. A mask having at least one opening associated with the pads set over the surface of the substrate, wherein each opening consisted of a first sub-opening and a second sub-opening are used to expose a portion of one of the pads. A conductive layer is then deposited on each one of the exposed first sub-opening and a second sub-opening. After removing the mask, a passive device is set on the conductive layer formed on the pads. Subsequently, a heat treatment is conducted to the substrate, passive device and the conductive layer to fix the passive device on to the substrate.

Accordingly, the features of the present surface mounting method provided by the present invention is to form a solder conductive layer having a plurality of separated potions associated with the pads set on a substrate to fix passive devices on to the substrate via a solder reflow process and to avoid the failure of the electrical contact formed between the substrate and the passive device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
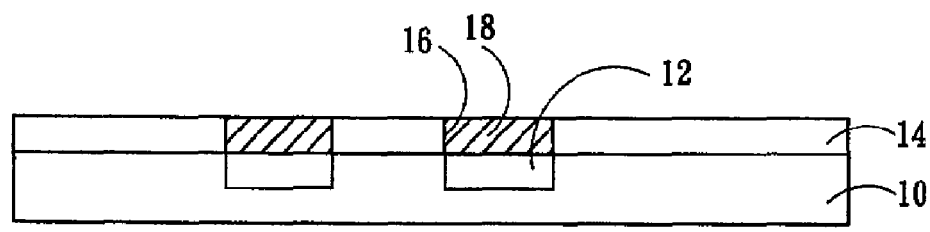
FIGS. 1A and 1B illustrate cross views of a conventional surface mooting process to form a passive component.
Figure 1B:
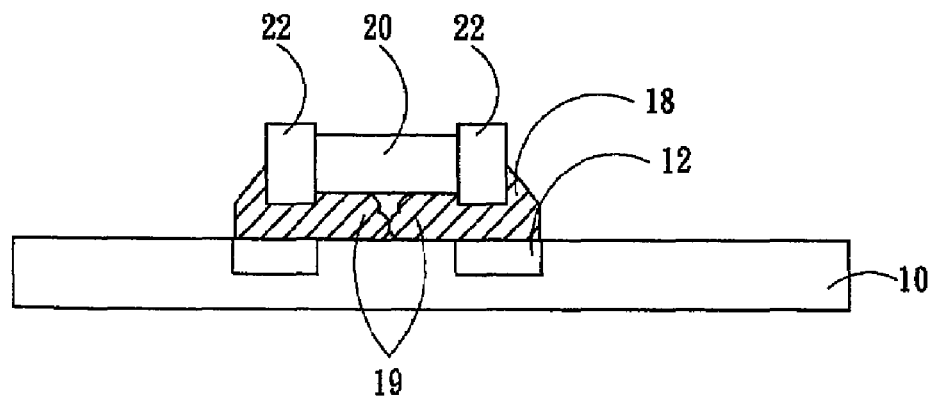

Embodiments pertaining to the present invention are provided by the following description. Except these embodiments, the feature of the present invention can be applied on other aspects. It is intended to cover various modifications and similar arrangements included within the spirit and scope of the appended claims, the scope of which should be accorded the broadest interpretation so as to encompass all such modifications and similar structure. For example, the detailed descriptions and drawing referring to a unit device or structure in the following embodiments is used to distinct the features of the present invention, but not limit scope of the present invention. When the detailed descriptions do not distinctly limit the numbers of an element, the device or structures with a plurality of the element should be included within the spirit and scope of the present invention. In addition, each element shown in the drawings may not be illustrated in proportion exactly, aspects and many of the attendant advantages of this invention will become more readily appreciated as some portions of element been scaled exaggeratedly or even been simplified.

Figure 2A:
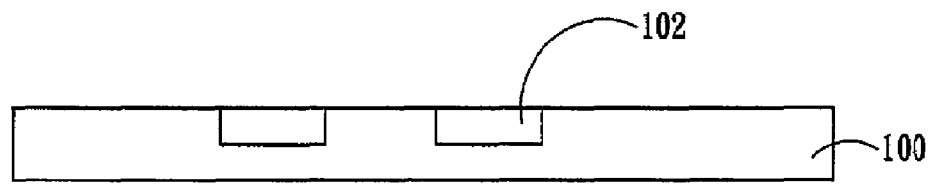
FIGS. 2A to 2F illustrate cross views of a surface mooting process to form a passive component in accordance with a preferred embodiment of the present invention. The surface mooting process comprises the following steps.

FIGS. 2A to 2F illustrate cross views of a surface mounting process to form a passive component in accordance with a preferred embodiment of the present invention. The surface mounting process comprises the following steps: First, a substrate 100 is provided. Referring to FIG. 2A, the substrate 100 can be a device carrier, a printed circuit board or other substrate in various types. The substrate has a plurality of pads 102 set on one surface of the substrate 100. The numbers of the pads are set depending upon the design of the passive device used to be mounted on the substrate 100. Generally, mounting a passive device on the substrate 100 occupies two pads 102. However the arrangements of the pads 102 are not limited, these may depend on the design of the passive device.

Figure 2B:
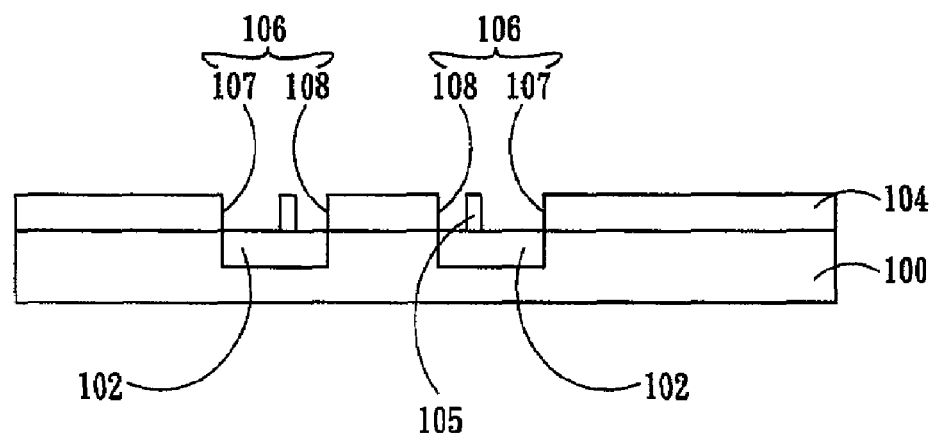
Figure 2C:
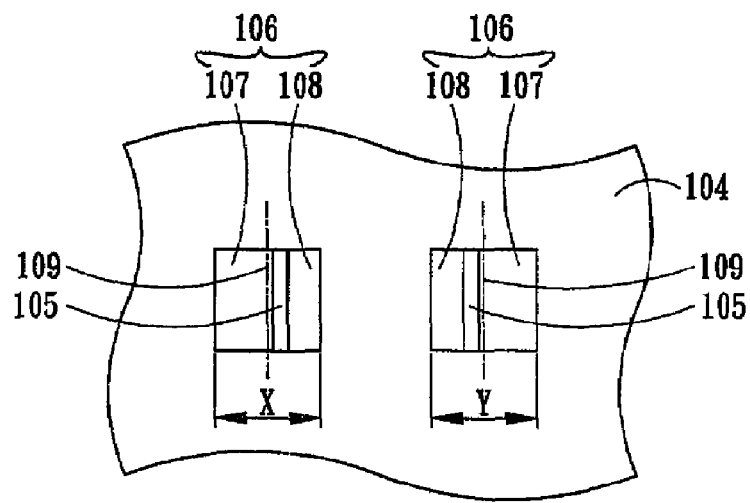
Figure 2D:
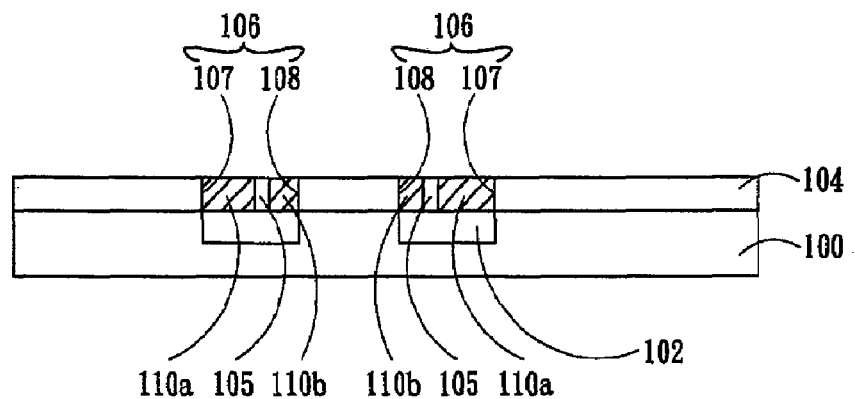

Referring to FIG. 2B, a mask 104 is then set over the surface of substrate 100 on which the pads 102 are set. The mask can be a steel printing plate, or a metal mask. FIG. 2C illustrates a vertical view of the mask 104 shown in FIG. 2B. The mask 104 has a plurality of openings 106, wherein each opening 106 is associated with one of the pads 102 is separated, and each opening 106 is separated into a plurality of sub-openings by a segregator 105. For example the each opening 106 of the present embodiment is consisted of a first sub-opening 107 and a second sub-opening 108 separated from each other. However in another embodiment the opening 106 can be separated into more sub-openings, for example three or four sub-openings, by the segregator 105. In the present embodiment, each of two adjacent openings 106 has a second sub-opening 108 joined with the second sub-opening 108 of the other opening 106, and the two first sub-openings 107 of the two adjacent openings 106 are separated by the two second sub-openings 108 of the two adjacent openings 106 (shown in FIGS. 2B and 2C), Suppose a passive device (shown in the FIG. 2E) is set over the opening 106, the distance between the center of the passive device and the first sub-opening 107 is greater than the distance between the center of the passive device and the second sub-opening 108.

The first sub-opening 107 is greater than the second sub-opening 108, and is greater than or equal to half an opening 106, thus each pad 102 is exposed from one of the openings 106 consisted of a first sub-opening 107 and a second sub-opening 108 with different sizes. In addition, each segregator 105 used to separate one of the openings 106 into a first sub-opening 107 and a second sub-opening 108 having a cross section occupies about ¼ or ⅓ area of the segregated opening 106, and the segregator 105 is set separated from the centerline Y of the segregated opening 106 by a distance about 0 to ⅕ times of the segregated opening 106 width X. The segregator 105 can be a portion of the mask 104. Alternatively, the segregator 105 can be a movable structure that is subsequently added after the mask is set. In addition, the segregator 105 can be shuffled in dependant to the process requirement during the surface mounting process.

Since each opening 102 is consisted of plurality of segregated sub-openings, such as the first sub-opening 107 and the second sub-opening 108, with different sizes, the solder conductive layer 110 subsequently formed on each pad 102 should be separated a plurality of segregated portions, such as portions 110a and 110b (shown in FIG. 2C). In the present embodiment, the segregated portion 110a is formed in the first sub-opening 107, and the segregated portion 110b is formed in the second sub-opening 108. Thus the volume of the segregated portion 110a of the solder conductive layer 110 is greater than that of the segregated portion 110b. The formation of the solder conductive layer 110 is to print solder on to the surface of the pads 102 exposed by the first sub-opening 107 and the second sub-opening 108. Since each segregator 105 occupies certain portion of the segregated opening 106, a portion of the pad 102 that is exposed by the opening 106 can be masked during the solder printing process, and the masked portion of the pad 102 contained no solder. Thus the solder consumption for forming the conductive layer 110 may be reduced in comparing with the prior art.

Figure 2E:
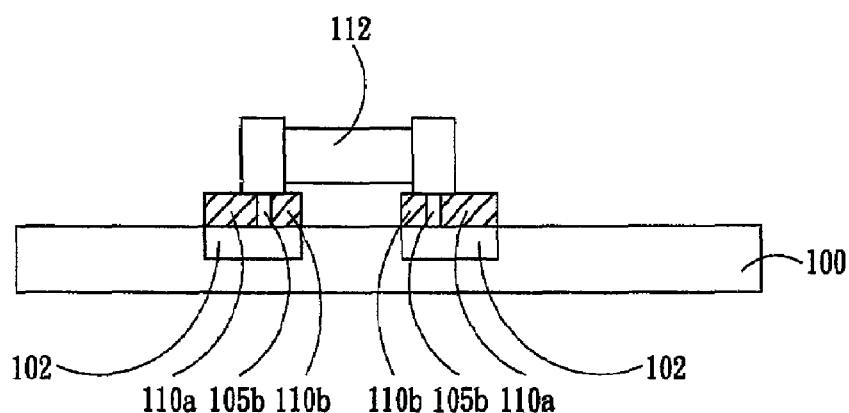

Regarding to FIG. 2E, after removing the mask 104 and the segregator 105, the segregated portions 110a and 110b of the conductive layer 110 are separated by a recess 105b in which the segregator 105 used to occupy. Subsequently a passive device 112 is set on the segregated portions 110a and 110b of the conductive layer 110, wherein the segregated portions 110a and 110b are respectively connected the grounding contact and the power contact of the passive device 110 with the substrate 100.

Figure 2F:
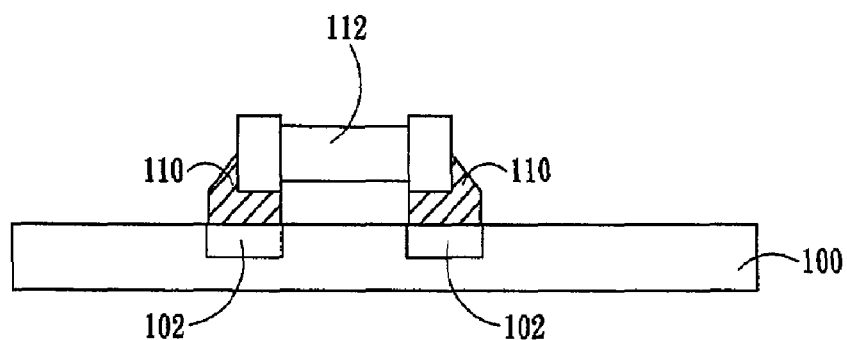

FIG. 2F illustrates the cross view after a heating treatment is conducted on the substrate 100, the passive device 112, and the conductive layer 110. During the heating treatment the solder conductive layer 110 can be melted. The pads 102 made of metal have better diffusibility against melted solder comparing with the substrate 100. Accordingly, the melted solder of the segregated portions 110a and 110b may diffuse towards the recesses 105 over the pads 102 but not spill out of the pads 102 on to the substrate 100 during the heating treatment. In addition, since the volume of the segregated portion 110a is greater than that of the segregated portion 110b, the melted solder of the segregated portion 110a has cohesion greater than that the segregated portion 110b to. Thus the melted solder of the segregated portion 110a can attract the segregated portion 110b to diffuse towards the recesses 105b so to avoid the solder spill out of the pads 102 on to the substrate 100. Accordingly, the melted solder of the segregated portions 110a and 110b diffuse towards the recess 105a due to the better diffusibility of the metal pads 112 against melted solder and the cohesion difference among the segregated portions (110a and 110b) of the conductive layer 110. The melted solder can coagulate on each pads 102 but not flow or spill on to undesirable portions of the substrate 100 so as to the electrical contact between the substrate 100 and the passive device 112 failure, consequently to increase yield of the end product. After the melted solder is cooled, the passive device 112 can fix on the substrate 100. The heating treatment preferably is a reflow process.

In accordance with the aforementioned embodiments, the features of the present invention are to form a solder conductive layer with a plurality of segregated portions on each pad of a substrate to fix a passive device thereon. When the solder conductive layer is melted during a reflow process, the melted segregated portions can coagulate on each pad due to due to the better diffusibility of the metal pads against melted solder and the cohesion difference among the segregated portions of the conductive layer. Consequently the melted solder conductive layer does not flow or spill on to undesirable portions of the substrate so as to avoid the electrical contact between the substrate and the passive device failure, consequently to increase yield of the end product. In additional since the solder conductive layer dose not entirely blanket over each pad, the solder consumption and the manufacturing cost can be reduced. Of note that the surface mounting method of the present invention may not limited on passive devices, it is intended to cover various modifications of surface mounting other similar devices.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A surface mounting method, comprising:
   providing a substrate having at least one pad set on one surface of the substrate;
   setting a mask having at least one opening on the substrate, wherein each opening associated with one of the at least one pad is separated into a plurality of sub-openings by a segregator to expose the pad;
   performing a printing process to form a conductive layer on each pad, wherein the conductive layer comprises at least two segregated portions on each pad;
   removing the mask;
   setting a passive device on the conductive layer over the pad; and
   performing a heating treatment to fix the passive device on the pad.

2. The surface mounting method according to claim 1, wherein the sub-openings comprises a first sub-opening and a second sub-opening.

3. The surface mounting method according to claim 2, wherein the first sub-opening is greater than the second sub-opening.

4. The surface mounting method according to claim 3, wherein the first sub-opening is greater than half of the opening.

5. The surface mounting method according to claim 4, wherein the distance between the center of the passive device and the first sub-opening is greater than the distance between the center of the passive device and the second sub-opening.

6. The surface mounting method according to claim 1, wherein the segregator having a cross section occupies about ¼ or ⅕ area of the opening.

7. The surface mounting method according to claim 1, wherein the segregator is set separated from the centerline of the segregated opening by a distance about 0 to ⅕ times of the segregated opening width.

8. The surface mounting method according to claim 1, wherein the mask is a steel plate.

9. The surface mounting method according to claim 1, wherein the conductive layer is made of solder.

10. A surface mounting method, comprising:
    providing a substrate, wherein the substrate comprising a plurality of pads formed on one surface of the substrate;
    forming a mask on the substrate, the mask comprising a plurality of openings to exposes the pads, wherein each opening comprises at lease one first sub-opening and at least one second sub-opening, and the first sub-opening is greater than the second sub-opening;
    form a conductive layer on each pad and filling the openings;
    removing the mask;
    forming a passive device on the conductive layer over the pad; and
    performing a heating treatment to fix the passive device on the pad.

11. The surface mounting method according to claim 10, wherein the first sub-opening is greater than half of the opening.

12. The surface mounting method according to claim 10, wherein the distance between the center of the passive device and the first sub-opening is greater than the distance between the center of the passive device and the second sub-opening.

13. The surface mounting method according to claim 10, wherein the first sub-opening and the second sub-opening are separated by a segregator, and the segregator having a cross section occupies about ¼ or ⅕ area of the opening.

14. The surface mounting method according to claim 13, wherein the segregator is set separated from the centerline of the segregated opening by a distance about 0 to ⅕ times of the segregated opening width.

15. The surface mounting method according to claim 10, wherein the mask is a steel plate.

16. The surface mounting method according to claim 10, wherein the conductive layer is made of solder.

* * * * *